United States Patent
Mimura

(10) Patent No.: US 10,332,764 B2
(45) Date of Patent: Jun. 25, 2019

(54) TEMPERATURE CONTROLLER OF SEMICONDUCTOR WAFER AND TEMPERATURE CONTROL METHOD OF SEMICONDUCTOR WAFER

(71) Applicant: KELK Ltd., Hiratsuka-shi, Kanagawa (JP)

(72) Inventor: Kazuhiro Mimura, Hiratsuka (JP)

(73) Assignee: KELK Ltd., Kanagawa (JP)

( * ) Notice: Subject to any disclaimer, the term of this patent is extended or adjusted under 35 U.S.C. 154(b) by 182 days.

(21) Appl. No.: 15/239,064

(22) Filed: Aug. 17, 2016

(65) Prior Publication Data
US 2018/0053669 A1    Feb. 22, 2018

(51) Int. Cl.
G06F 19/00 (2018.01)
H01L 21/67 (2006.01)
G05D 23/19 (2006.01)
H01L 21/66 (2006.01)
G05B 13/04 (2006.01)
G05D 23/22 (2006.01)

(52) U.S. Cl.
CPC ...... *H01L 21/67248* (2013.01); *G05B 13/041* (2013.01); *G05D 23/1917* (2013.01);
(Continued)

(58) Field of Classification Search
None
See application file for complete search history.

(56) References Cited

U.S. PATENT DOCUMENTS 4,797,835 A * 1/1989 Kurami ............... B25J 9/1628
                                                    700/252
6,564,194 B1 * 5/2003 Koza .................... G05B 11/42
                                                    706/13
(Continued)

FOREIGN PATENT DOCUMENTS

JP    11-219221    8/1999
JP    2001-096608    4/2001
(Continued)

OTHER PUBLICATIONS

Haruyama "Design of a Model-Following Servo Controller for Multiple-input-multiple-output Systems with Improved Robustness", 2016, IEEE 12th International Colloquium on Signal Processing & its Applications (Year: 2016).*
(Continued)

*Primary Examiner* — Brian W Wathen
*Assistant Examiner* — Hung H Dang
(74) *Attorney, Agent, or Firm* — Fish & Richardson P.C.

(57) ABSTRACT

A plurality of temperature adjusters each independently include a control loop. A manipulated variable calculator is configured to give manipulated variables to the respective temperature adjusters and includes a reference model output generator configured to provide a reference model as a response output for reaching a temperature setpoint when a first control loop having a slowest response speed among the control loops is defined to have a 100% manipulated variable. The reference model output generator includes: a simulator configured to determine a manipulated variable pattern by conducting successive search of a switching time; and a reference model obtained from a response in which, among the plurality of control loops, the first control loop having the slowest response speed is defined to have the 100% manipulated variable, and the rest of the plurality of control loops are controlled to follow the first control loop.

7 Claims, 14 Drawing Sheets

(52) U.S. Cl.
CPC ......... *G05D 23/1934* (2013.01); *G05D 23/22* (2013.01); *H01L 22/26* (2013.01); *H01L 21/67109* (2013.01)

(56) References Cited

U.S. PATENT DOCUMENTS

| | | | |
|---|---|---|---|
| 2009/0183677 A1 | 7/2009 | Tian et al. | |
| 2015/0212528 A1* | 7/2015 | Mimura | H01L 21/67248 700/300 |
| 2018/0004172 A1* | 1/2018 | Patel | F24F 11/30 |

FOREIGN PATENT DOCUMENTS

| | | |
|---|---|---|
| JP | 2001-273002 | 10/2001 |
| JP | 2002-318602 | 10/2002 |
| JP | 2009-173969 | 8/2009 |
| JP | 2010-223066 | 10/2010 |
| JP | 2011-237848 | 11/2011 |

OTHER PUBLICATIONS

Matsumoto, "Temperature control of wafer in semiconductor manufacturing systems by MR-ILQ design method", 2004, Proceedings of the 2004 IEEE International Conference on Control Applications (Year: 2004).*

Japanese Office Action in Japanese Application No. 2014-133305, dated Feb. 13, 2018, 7 pages (with English Translation).

Japanese Office Action in Japanese Application No. 2014-133305, dated Aug. 28, 2018, 2 pages (with English Translation).

* cited by examiner

US 10,332,764 B2

TEMPERATURE CONTROLLER OF SEMICONDUCTOR WAFER AND TEMPERATURE CONTROL METHOD OF SEMICONDUCTOR WAFER

TECHNICAL FIELD

The present invention relates to a temperature control device for a semiconductor wafer and a temperature control method for a semiconductor wafer, which are configured to perform a temperature control of a plurality of temperature adjusters to perform a temperature adjustment of the semiconductor wafer.

BACKGROUND ART

A process for treating a semiconductor wafer such as a silicon wafer includes controlling an in-plane temperature distribution of the silicon wafer as desired while controlling a temperature of the silicon wafer to a temperature setpoint.

For this purpose, there has been known a method of controlling the temperature of the semiconductor wafer simultaneously using a plurality of temperature adjusters through control loops respectively provided to the temperature adjusters.

As such a control method in a multi-input multi-output system, a model following servo control system has been known (see, for instance, Patent Literature 1: JP-A-2009-173969).

In the model following servo control system, a model (e.g., second-order lag system) having dynamic characteristics desirable as a reference model is generally selected.

Accordingly, in setpoint response, a control variable follows a step response of the model as a reference trajectory.

When a manipulated variable has upper and lower limits (saturation), the model is selected so that the maximum speed is obtainable preferably in a range where the manipulated variable does not reach the saturation. On the other hand, in order to improve throughput in the process, it is desirable to intentionally bring the manipulated variable to saturation to reach the setpoint at the highest speed in the shortest time of period.

However, in a heating plate having multiple zones (multi-input multi-output system) as described in Patent Literature 1, heating at the saturation level of the manipulated variable deteriorates temperature uniformity between the zones since the zone heated at the slowest speed is delayed from the other zones in a temperature increasing speed.

SUMMARY OF THE INVENTION

An object of the invention is to provide a temperature control device for a semiconductor wafer and a temperature control method for a semiconductor wafer, which ensure a following ability (uniformity) of control variables among loops and allow a controlled target to achieve a setpoint response almost at the highest possible speed, even when saturation of an actuator occurs in the setpoint response.

In a first aspect of the invention, a temperature controller for a semiconductor wafer, which is configured to perform a temperature control of a plurality of temperature adjusters to perform a temperature adjustment of the semiconductor wafer, includes: a plurality of control loops set to the respective plurality of temperature adjusters; a plurality of temperature detectors provided in the respective control loops and each configured to detect a temperature of the semiconductor wafer subjected to the temperature adjustment by the temperature adjusters; and a manipulated variable calculator configured to calculate a manipulated variable to be given to each of the temperature adjusters of the respective control loops, based on the temperature detected by each of the temperature detectors, in which the manipulated variable calculator performs: a reference model obtained from a response in which, among the plurality of control loops, a first control loop having a slowest response speed is defined to have a 100% manipulated variable, and the rest of the plurality of control loops are controlled to follow the first control loop; an optimum manipulated variable pattern search unit configured to search for an optimum manipulated variable pattern for reaching a temperature setpoint of the semiconductor wafer in a shortest period of time using the reference model; a reference model output generator configured to give a manipulated variable of the optimum manipulated variable pattern searched by the optimum manipulated variable pattern search unit to the reference model; and a model following servo calculator configured to use an output of the reference model obtained by the reference model output generator as a reference model output.

In a second aspect of the invention, the optimum manipulated variable pattern search unit determines, as the shortest period of time, a time for minimizing an evaluation function J represented by a formula (1) when the temperature setpoint is denoted by SV and a response output at a time t is denoted by PV, $$J = \int |SV - PV| dt \qquad (1)$$

In a third aspect of the invention, a temperature control method of a semiconductor wafer, includes: performing a temperature control of a plurality of temperature adjusters to perform a temperature adjustment of the semiconductor wafer by a temperature controller, in which the temperature controller includes: a plurality of control loops set to the respective plurality of temperature adjusters; a plurality of temperature detectors provided in the respective control loops and each configured to detect a temperature of the semiconductor wafer subjected to the temperature adjustment by the temperature adjusters; and a manipulated variable calculator configured to calculate a manipulated variable to be given to each of the temperature adjusters of the respective control loops, based on the temperature detected by each of the temperature detectors, in which the manipulated variable calculator performs: a step of searching for a manipulated variable pattern for reaching a temperature setpoint of the semiconductor wafer in a shortest period of time using a reference model obtained from a response in which, among the plurality of control loops, a first control loop having a slowest response speed is defined to have a 100% manipulated variable, and the rest of the plurality of control loops are controlled to follow the first control loop; a step of giving a manipulated variable of the optimum manipulated variable pattern searched by the optimum manipulated variable pattern search unit to the reference model to generate an output of the reference model; and step of executing a model following servo calculation in which an output of the obtained reference model is used as a reference model output to calculate a manipulated variable for a controlled target.

According to the first aspect of the invention, since a reference model is obtained from a response in which, among the plurality of control loops, the first control loop having the slowest response speed is defined to have a 100% manipulated variable and the rest of the plurality of control loops are controlled to follow the first control loop, and the optimum manipulated variable pattern search unit searches for the optimum manipulated variable pattern to be given until reaching the temperature setpoint using the obtained reference model, a setpoint response can be achieved almost at the maximum possible speed of the controlled target while ensuring the following ability (uniformity) of the control variables among the loops.

According to the second aspect of the invention, since the optimum manipulated variable pattern search unit searches using the evaluation function represented by the formula (1), the evaluation can be made with a simple evaluation function, thereby reducing burden of calculating the manipulated variable.

According to the third aspect of the invention, the same operation and effects as in the first aspect of the invention can be obtained.

DESCRIPTION OF EMBODIMENT(S)

Exemplary embodiment(s) of the invention will be described below with reference to the attached drawings.

1. Structure of Temperature Adjustment Device 1

Figure 1:
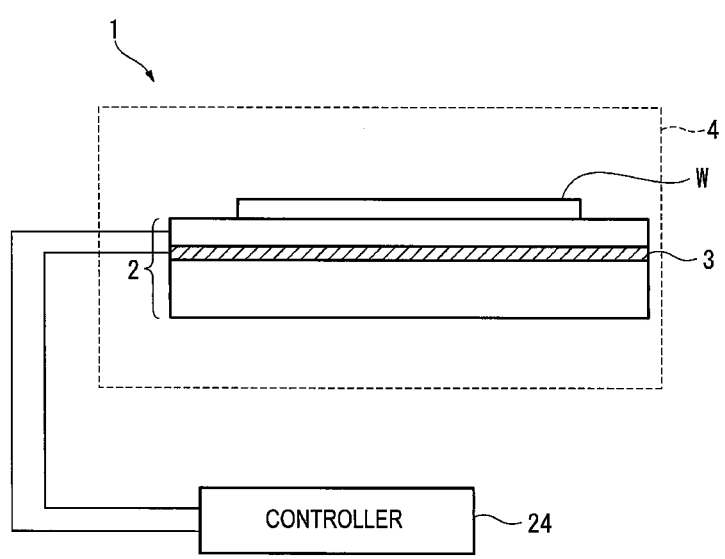
FIG. 1 is a block diagram showing a temperature adjustment device according to an exemplary embodiment of the invention.

FIG. 1 shows a temperature adjustment device 1 according to a first exemplary embodiment of the invention. The temperature adjustment device 1 controls a temperature of a silicon wafer W placed on a plate-shaped stage 2 to a temperature setpoint to control an in-plane temperature distribution of the silicon wafer W. The temperature adjustment device 1 is used in, for instance, a dry process.

The temperature adjustment device 1 includes the plate-shaped stage 2 and a temperature adjuster 3. The temperature adjuster 3 is preferably provided in a form of a chiller device or a thermoelectric element when used for heating and cooling control. When used only for heating control, the temperature adjuster 3 can be in a form of a heater.

The stage 2 is disposed in a vacuum chamber 4. The silicon wafer W is placed on the stage 2. The silicon wafer W is kept held on the stage 2 by static electricity. Helium gas may be flowed between the stage 2 and the silicon wafer W, thereby increasing a heat transfer efficiency between the stage 2 and the silicon wafer W.

In the dry process, the vacuum chamber 4 is air-purged to be kept at a predetermined low pressure state.

Figure 2A:
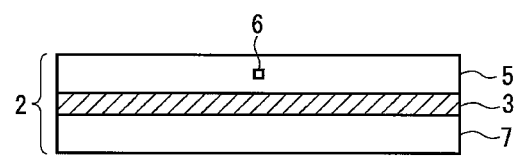
FIG. 2A is a cross-sectional view showing an arrangement of a temperature adjuster and a temperature sensor in the exemplary embodiment.
Figure 2B:
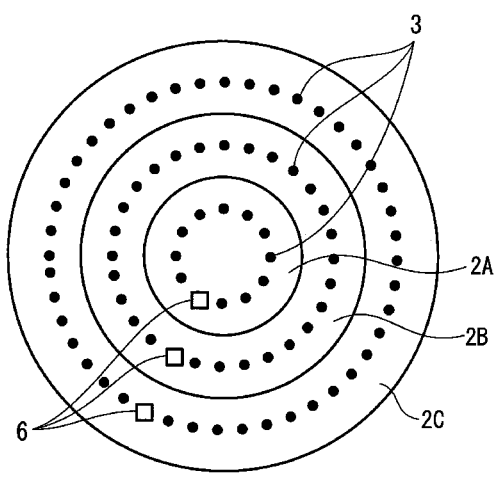
FIG. 2B is a plan view showing the arrangement of the temperature adjuster and the temperature sensor in the exemplary embodiment.

In the stage 2, a plurality of temperature adjusters 3 are disposed as shown in FIGS. 2A and 2B so as to adjust the in-plane temperature distribution of the silicon wafer W placed on the stage 2.

FIG. 2A is a cross-sectional view of the stage 2. The temperature adjusters 3 are disposed on a base plate 7. A plate 5 is placed on the temperature adjusters 3. Temperature sensors 6 are provided as a temperature detector in the plate 5.

FIG. 2B is a plan view of the stage 2. The stage 2 is divided into three concentric zones 2A (a later-described zone 1), 2B (a later-described zone 2), and 2C (a later-described zone 3), in each of which the temperature adjusters 3 are disposed. The temperature sensors 6 in the plate 5 are disposed at positions corresponding to the temperature adjusters 3.

When the temperature adjusters 3 are electrified, the zones 2A, 2B, 2C of the stage 2 can be each independently heated and cooled. Accordingly, by adjusting electrification to each of the temperature adjusters 3 to control the temperature adjusters 3, the in-plane temperature distribution of the silicon wafer W on the stage 2 is adjustable. The temperature adjusters 3 in each of the zones 2A, 2B and 2C are controlled by a controller 24.

2. Structure of Controller 24

Figure 3:
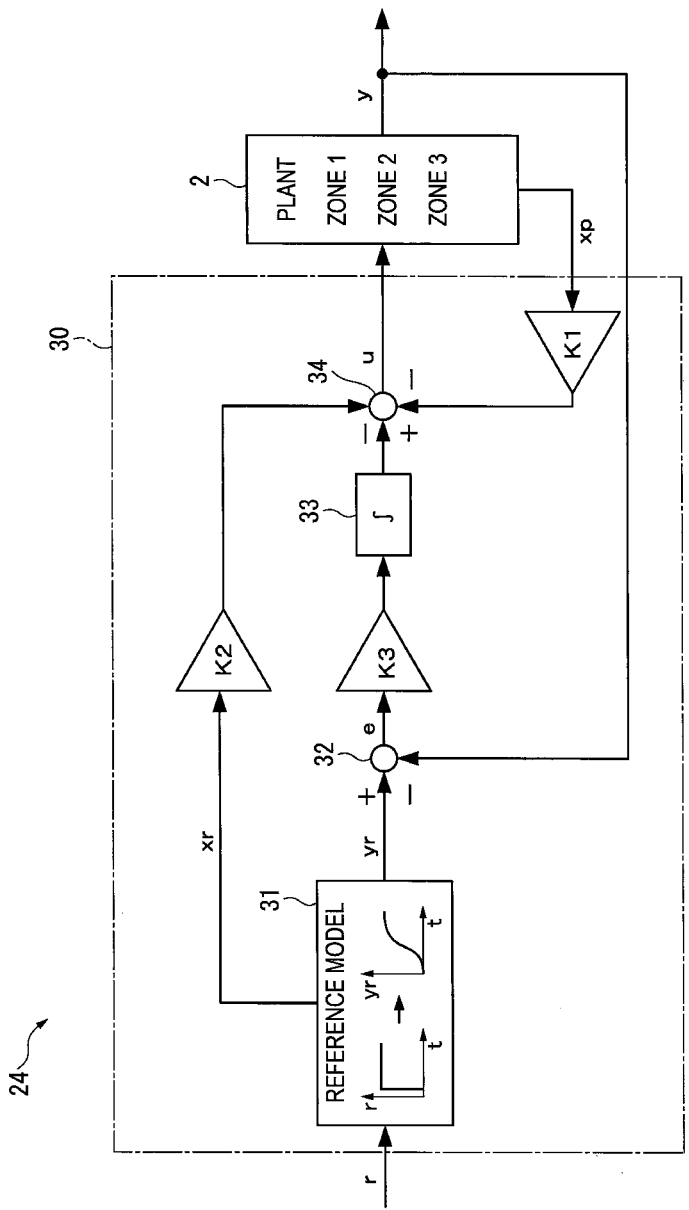
FIG. 3 is a block diagram showing a structure of a controller configured to control the temperature adjustment device in the exemplary embodiment.

FIG. 3 is a block diagram of the controller 24 according to the exemplary embodiment. The controller 24 includes a manipulated variable calculator 30. The manipulated variable calculator 30 includes a reference model output generator 31, a error calculator 32, an integrator 33, and a error calculator 34 and conducts a general model following control. A state feedback gain K1 is set for an output from each of the temperature sensors 6 of the stage 2. A state feedforward gain K2 is set for an output from the reference model output generator 31. A gain K3 is set for the integrator 33. An input and an output to each of elements in each of the block diagrams are shown below.

r: temperature setpoint
yr: reference trajectory
xr: states of the reference model
e: error
u: manipulated variable
y: control variable (temperature)
xp: states of a controlled target In FIG. 3, the states xp of the controlled target are directly observable from the controlled target. However, when the states xp cannot be observed, an estimation value obtained by using an estimator may be used in place of the states xp.

Assuming that the stage 2 (the controlled target) employs a multi-input multi-output (an m-input m-output) system, state variables of the controlled target are expressed by formulae (2) and (3).

$$x_p(k+1)=A_p x_p(k)+B_p u(k) \tag{2}$$

$$y(k)=C_p x_p(k) \tag{3}$$

wherein, the formulae (2) and (3) are a vector or matrix of $$x_p{:}n{\times}1, u{:}m{\times}1, y{:}m{\times}1, A_p{:}n{\times}n, B_p{:}n{\times}m, C_p{:}m{\times}n$$

Each of gain matrixes K1, K2 and K3 is represented by the following formula (4).

$$K1{:}m{\times}n, K2{:}m{\times}p, K3{:}m{\times}m \tag{4}$$

The reference model selectively employs a linear system (a state equation and a transfer function) having desired response (dynamic characteristics), a step response of which control variables are made to follow without an error. In a multi-input multi-output system, as long as the reference model is the same in all the loops, uniformity among the loops can be expected since the control variables are made to follow the same reference trajectory.

The gains (K1, K2, K3) of the parts are determined using an optimal control method. Since this method has merits (stability guaranty and robustness) of the optimal control method and is applicable without considering decoupling, this method is suitable for a multi-input multi-output system with interaction such as the present controlled target.

However, with respect to use of an ability of the controlled target at the maximum level so as to increase the throughput in the process, the following problems are found in a typical model following control.

Specifically (described later in more detail), in controlling the multi-input multi-output system, when the control loops have the respective different response speeds and a manipulated variable of any one of the control loops reaches saturation, a control variable of the control loop having reached the saturation cannot follow the reference trajectory, so that the uniformity of the control variables among the loops in a transient state cannot be occasionally maintained.

In the exemplary embodiment, the transfer function to allow such a desirable step response as to satisfy control requirements in a typical model following control is used as the reference model.

However, the resultant reference trajectory is just a step response of the transfer function. In terms of the manipulated variable in a control system, in order to satisfy the requirement of "reaching a temperature setpoint in the shortest time of period," it is desirable to bring the manipulated variable to the saturation, namely, at the largest output, thereby reaching the setpoint.

Herein, an ideal response satisfying the requirement is described at first and the response is realized next.

Figure 4:
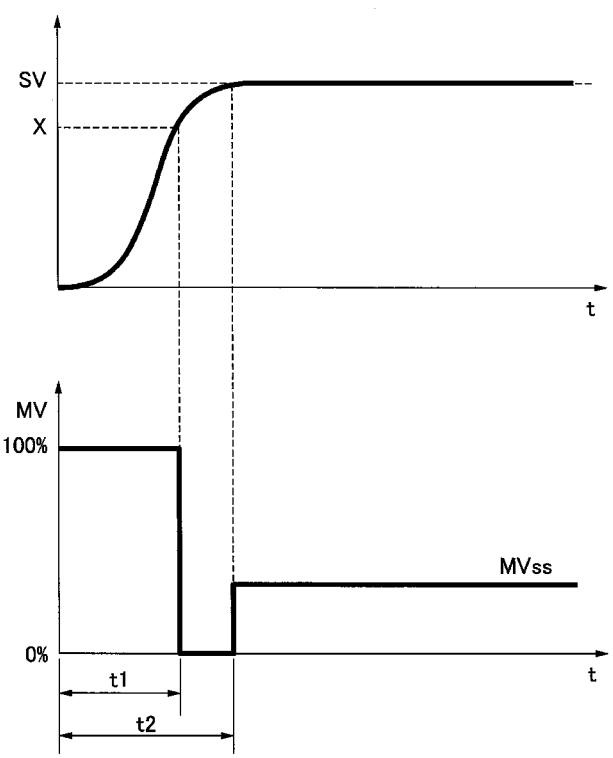
FIG. 4 is a graph for explaining a reference model in the exemplary embodiment.

A manipulated variable pattern for reaching a final setpoint SV in the shortest period of time is obtainable, as shown in FIG. 4, by accelerating with the maximum manipulated variable up to a middle point X, decelerating with the minimum manipulated variable from the point X to the final setpoint SV, and switching the minimum manipulated variable to a manipulated variable MVss required for keeping a current level after reaching the final setpoint SV.

Figure 5A:
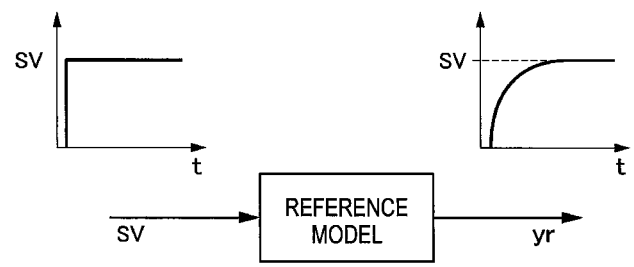
FIG. 5A is a schematic diagram for explaining the reference model obtained in the exemplary embodiment.

When this manipulated variable pattern is inputted to a plant model, a plant should reach the setpoint in the shortest period of time. Accordingly, although a step input is only given to the transfer function expressing a desirable step response in a typical model following control as shown in FIG. 5A, it is assumed to input the manipulated variable pattern for controlling in the shortest period of time directly to the plant model as shown in FIG. 5B.

Figure 5B:
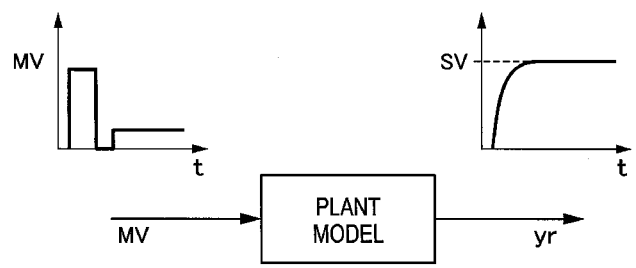
FIG. 5B is another schematic diagram for explaining the reference model obtained in the exemplary embodiment.

In the multi-input multi-output system, the number of the manipulated variable pattern as shown in FIG. 5B needs to be equal to the number of the control loops. Moreover, unless the control variables of the respective control loops are uniform under interaction, the reference trajectory to be followed does not become uniform. Since it is extremely difficult to make such a manipulated variable pattern only by combining step signals, the following method is taken.

(1) With use of a plant model Gp(s), a response at the maximum speed achievable while keeping uniformity of the control variables of the respective control loops is determined. A 100% manipulated variable MV is given to the slowest response zone among the three zones. A manipulated variable to allow the maximum speed achievable while keeping uniformity when the remaining two zones follow the response of the slowest response zone is given to the remaining two zones.

(2) The slowest control loop is selected from response waveforms obtained in the above (1) to be assumed as a response by a step input. A reference model Gm(s) of a first-order lag+dead time system is obtained by a system identification.

(3) With respect to the reference model Gm(s) obtained in the above (2), a manipulated variable pattern for realizing the time optimal control is determined by successive simulation. Herein, given that the maximum manipulated variable is switched to a manipulated variable in a stationary state after the elapse of t1 seconds since control starts, an optimum value of t1 is searched.

As an evaluation function used for searching for the optimum value, for instance, an IAE (Integral of Absolute Error) evaluation standard represented by a formula (5) below is used to search for a manipulated variable pattern allowable for the minimum evaluation function.

$$J=\int |SV-PV|dt \tag{5}$$

(4) Since the reference trajectories of all the control loops become common by using Gm(s) as the reference model for all input and output, uniformity of the control variables among the control loops can be expected. It is also possible to prepare the same number of the reference model as the number of the loops and give an individual different setpoint to each of the reference models.

Figure 6:
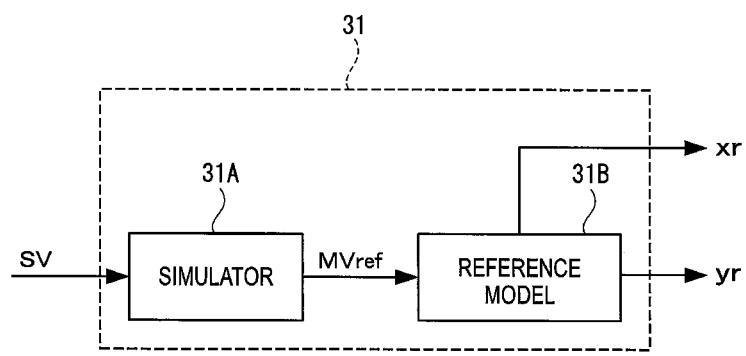
FIG. 6 is a block diagram showing a structure of a reference model output generator in the exemplary embodiment.

As shown in FIG. 6, the reference model output generator 31 includes a simulator 31A and a reference model 31B obtained by the above procedure. An input of the reference model 31B is not an input of the temperature setpoint as in a typical method but an input of a manipulated variable pattern at the same level as that of the controlled target 2.

Accordingly, it is necessary to correspond the temperature setpoint SV to a manipulated variable pattern MVref.

At the input of the temperature setpoint SV, the simulator 31A successively searches for a switching time to determine the manipulated variable pattern MVref. In the exemplary embodiment, the optimum time is obtained through the successive online search using the simulator 31A. However, the process for obtaining the optimum time is not limited to the above, but which a table of a manipulated variable pattern may be prepared in advance in which the temperature setpoint SV on the controlled target and the like is associated with the optimum time reaching the temperature setpoint in the shortest time, and an optimum manipulated variable pattern may be searched with reference to this table in response to the input of the temperature setpoint SV.

The reference model 31B determines a response at a realizable maximum speed while keeping the control variables of the respective control loops using the plant model Gp(s), and gives a 100% manipulated variable to the slowest response zone to obtain the reference model Gm(s), for instance, using a first-order lag+dead time system as represented by a formula (6) below.

$$Gm(s) = \frac{K}{Ts+1} \cdot e^{Ls} \quad (6)$$

K: gain

T: time constant

L: dead time

3. Operations in Embodiment(s)

Figure 7:
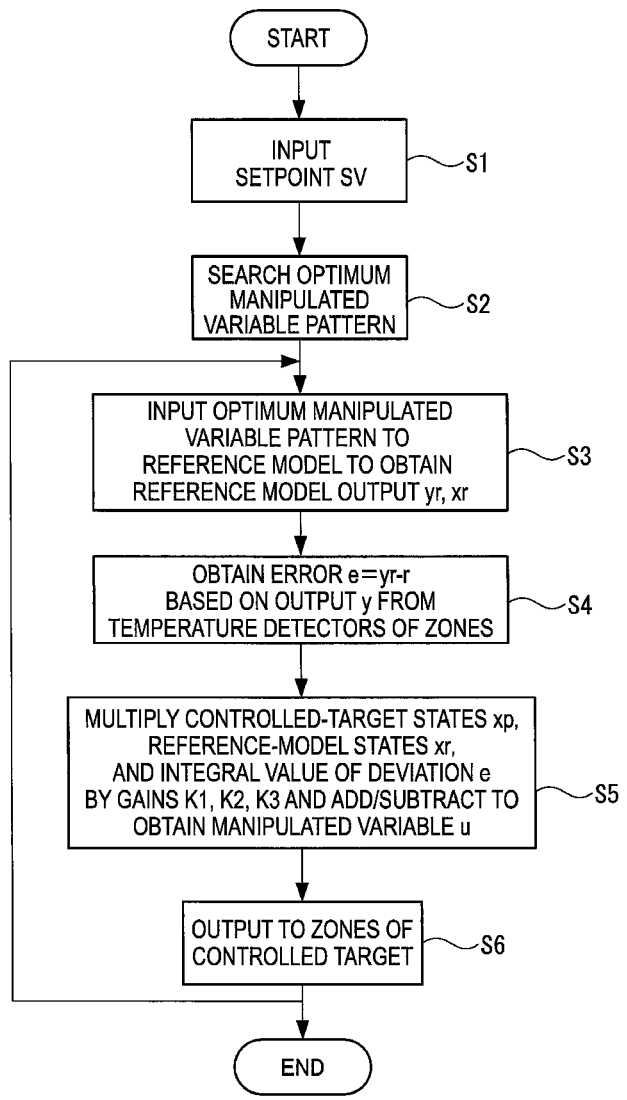
FIG. 7 is a flowchart for explaining operations in the exemplary embodiment.

Next, a calculation procedure of the exemplary embodiment will be described with reference to a flow chart shown in FIG. 7.

When the temperature setpoint SV of each of the zones is inputted to the reference model output generator 31 (Step S1), an optimum manipulated variable pattern is searched with the simulator 31A (Step S2).

The optimum manipulated variable pattern obtained by the search is inputted to the reference model 31B to obtain a reference trajectory yr and a reference-model states xr as a reference model output (Step S3).

An error e is obtained based on the reference trajectory yr and an output y from the temperature sensor 6 in each of the zones (Step S4).

A control target states xp, a reference-model states xr, and an integral value of the error e obtained in Step S4 are respectively multiplied by the gains K1, K2, K3 and the obtained values are converted into a manipulated variable u through addition and subtraction (Step S5). The manipulated variable u is outputted to the temperature adjuster 3 of each of the zones 1 to 3 (Step S6)

Figure 8:
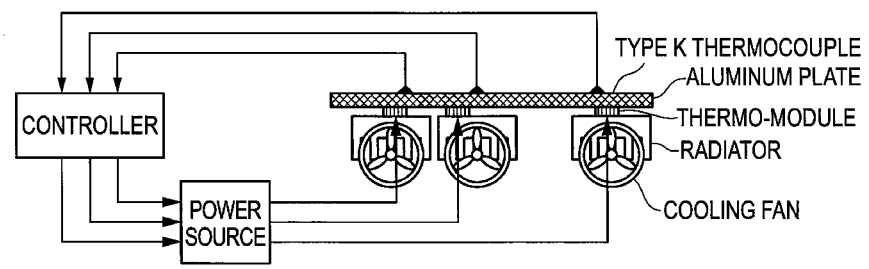
FIG. 8 is a schematic diagram showing a control system used for simulation for checking effects in the exemplary embodiment.
Figure 9:
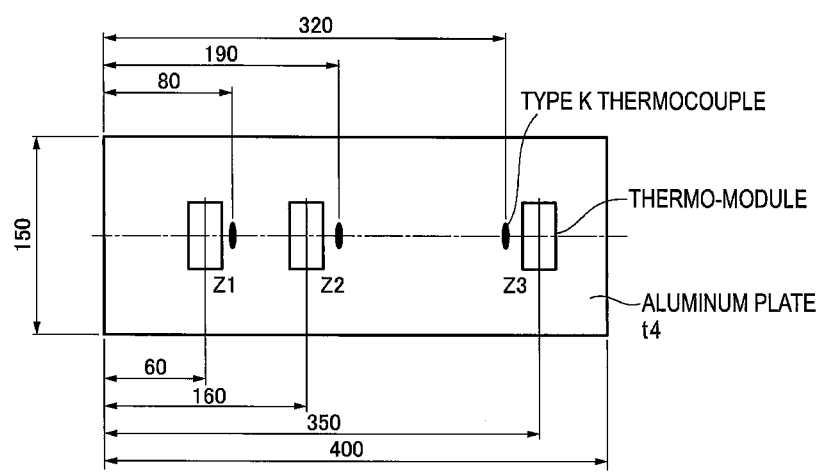
FIG. 9 is a plan view showing the control system used for simulation for checking effects in the exemplary embodiment.

4. Check of Effects of Invention by Simulation 4-1. Structure of Control System in Simulation Control of a three-input three-output system will be exemplarily described with a simulation result obtained by modeling a control system shown in FIG. 8. This control system is a system for controlling a temperature of an aluminum plate of 400×150×t4 as shown in FIG. 9 and uses an actuator in a form of three thermo-modules configured to heat and cool the plate. The temperature of the aluminum plate is measured by three type K thermocouples provided near the respective modules. The thermo-module are intentionally disposed asymmetrically relative to a longitudinal direction of the plate, which is shown in dimensional detail in FIG. 9. Zones 1, 2 and 3 are defined from the left in the figure.

4-2. Problem(s) by Typical Method

Figure 10A:
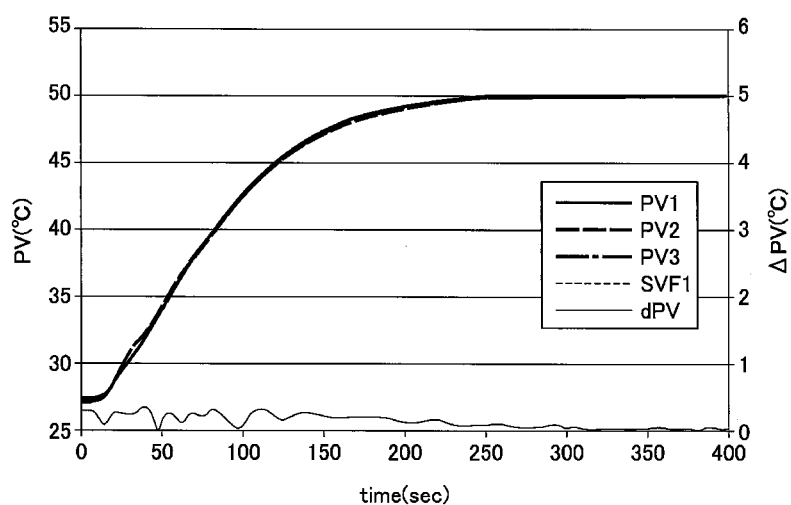
FIG. 10A is a graph showing results of simulation by a typical model following control.
Figure 10B:
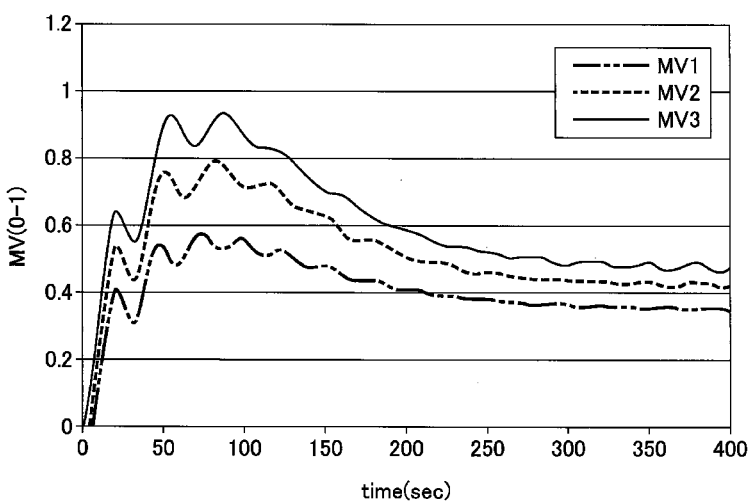
FIG. 10B is a graph showing results of simulation by the typical model following control.

A model following control controller was designed for this testing plant. A heating experiment from an equilibrium temperature 25 degrees C. to a temperature setpoint 50 degrees C. was conducted as a setpoint response control experiment. Results of setpoint response characteristics are shown in FIGS. 10A and 10B. FIG. 10A shows temperatures (PV1, PV2, PV3) of the respective zones, a reference trajectory (SVF1) of the reference model, and a temperature difference (dPV) between the zones exhibiting uniformity. The temperature difference (dPV) between the zones is a difference between the maximum zone temperature and the minimum zone temperature at a point of time. FIG. 10B shows the manipulated variables to the respective zones.

Herein, the reference model employs a second-order lag system in which a natural angular frequency $\omega 0=1/45$ (rad/sec) and an attenuation coefficient $\zeta=0.9$ were defined as a response without saturation of a manipulated variable. As understood from FIGS. 10A and 10B, the temperatures of the respective zones 1 to 3 follow the reference trajectory very closely and the temperature difference between the zones is as small as 0.35 degrees C. at the most. Moreover, the manipulated variables of the respective zones 1 to 3 fall within the range in which the manipulated variables do not reach the saturation.

Figure 11A:
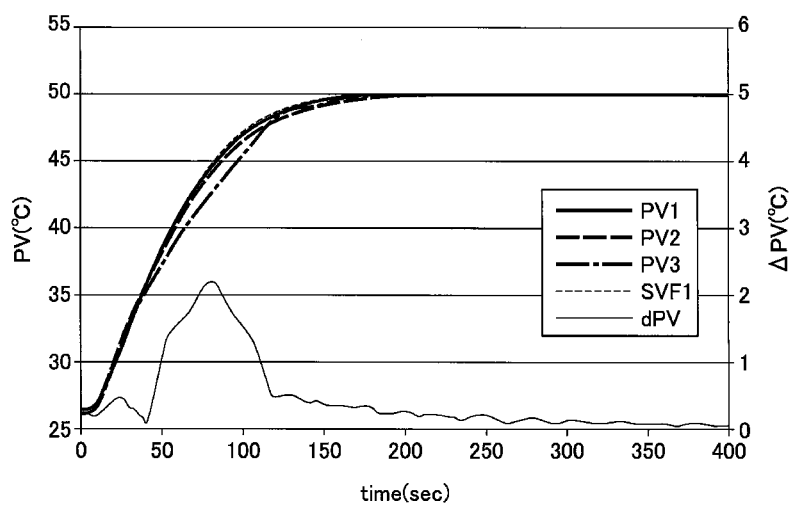
FIG. 11A is a graph showing results of simulation with respect to typical problems.
Figure 11B:
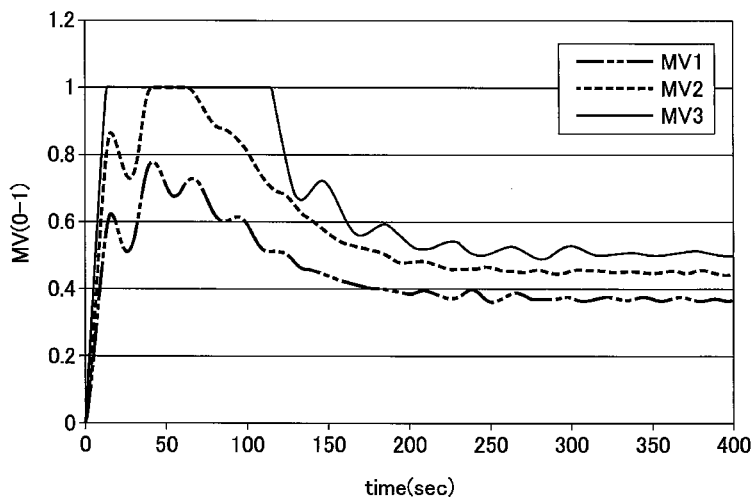
FIG. 11B is another graph showing results of simulation with respect to the typical problems.

Next, in order to accelerate the response speed, the natural angular frequency of the reference model was changed to $\omega 0=1/30$ (rad/sec). Results of the setpoint response characteristics in this specification are shown in FIGS. 11A and 11B. FIGS. 11A and 11B show the same as FIGS. 10A and 10B. By accelerating the response speed of the reference model, the manipulated variable in the zone 3 reaches the saturation, resulting in accelerating the following response as shown in FIG. 11B.

However, since the manipulated variable reaches the saturation in the zone 3, the speed can no longer be accelerated, so that following to the reference trajectory in the zones 1 and 2 is delayed to deteriorate the temperature uniformity between the zones to 2.1 degrees C. in a transient response.

In the above case where a typical model following control is used for controlling a multi-input multi-output system, when a manipulated variable reaches saturation, a control variable of a control loop with the saturation cannot follow the reference trajectory, so that the uniformity of the control variables among the loops in a transient state occasionally cannot be maintained.

4-3. Check of Effects by Simulation Using Test Plant

In contrast, when effects are checked in the exemplary embodiment by simulation using the test plant, results are shown as follows.

(1) Measurement of Maximum Speed Response

Figure 12:
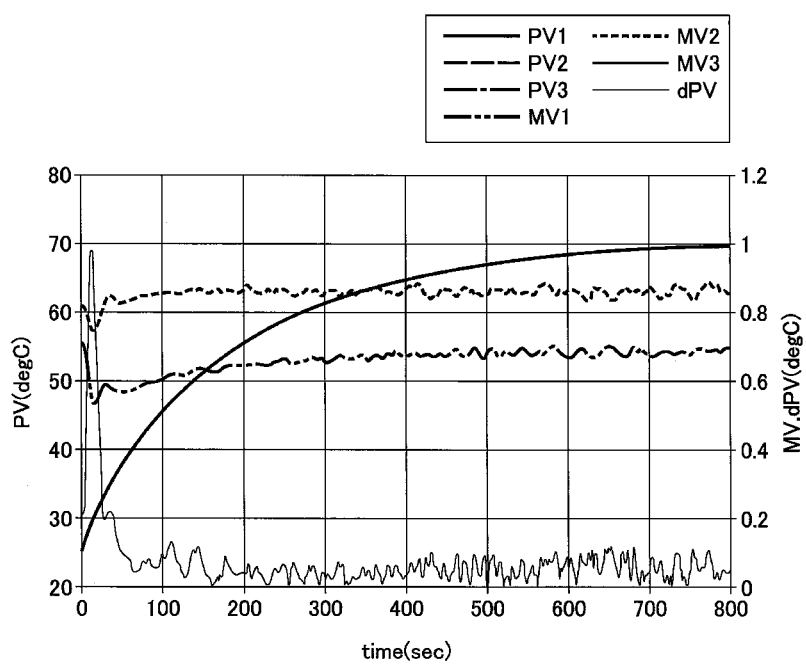
FIG. 12 is a graph showing simulation results in the maximum response waveform in the exemplary embodiment.

FIG. 12 shows the maximum speed response waveform achievable while the controlled target keeps uniformity. In the figure, PV1 to PV3 represent the temperatures of the respective zones 1 to 3, MV1 to MV3 represent the manipulated variables given to the respective zones 1 to 3, and dPV represents uniformity.

This is easily achievable in a form of a PID control in which, for instance, the zone 3 having the slowest speed is fixed with a maximum manipulated variable and defined as a master and two remaining zones are defined as a slave.

Since the manipulated variable of the zone 3 is at the maximum, a response having a higher speed cannot be expected. It is understood that the temperature difference between the zones at and after the elapse of first 50 seconds is approximately 0.1 degrees C. or less.

(2) Identification of Reference Model

The waveform of the zone 3 in this response was regarded as a step response and identified to a first-order lag+dead time system, As a result, a reference model Gm(s) was obtained by a formula (7) below.

$$Gm(s) = \frac{44.2}{178s+1} \cdot e^{-4s} \qquad (7)$$

(3) Determination of Switching Time of Manipulated Variable

Figure 13A:
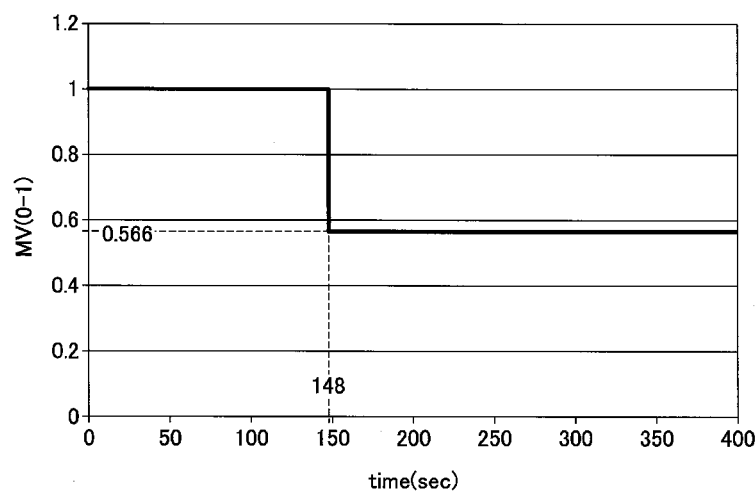
FIG. 13A is a graph showing how to obtain an optimum time in the exemplary embodiment.
Figure 13B:
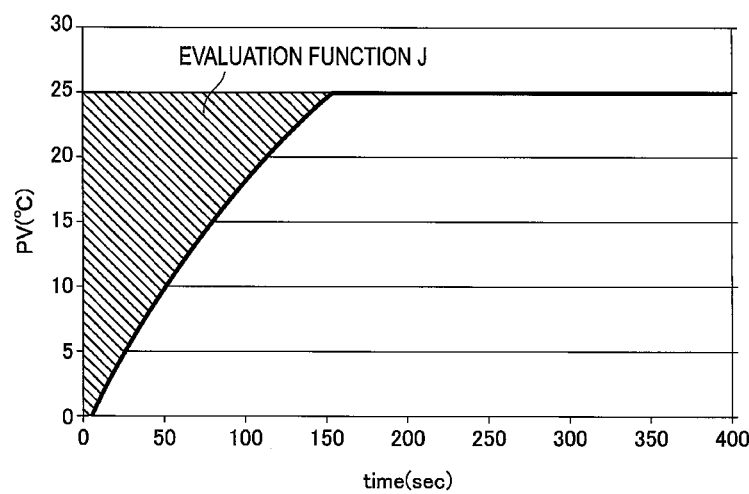
FIG. 13B is another graph showing how to obtain the optimum time in the exemplary embodiment.

FIG. 13A shows a manipulated variable pattern. FIG. 13B shows an output of the reference model output of the formula (7). An optimum value of a switching time for ΔT=25 degrees C. was found to be 148 seconds through a successive search simulation with use of the evaluation function (an shaded area in FIG. 13B) represented by the formula (5).

Moreover, a manipulated variable at a stationary time was found to be 25/44.2=0.566.

Figure 14A:
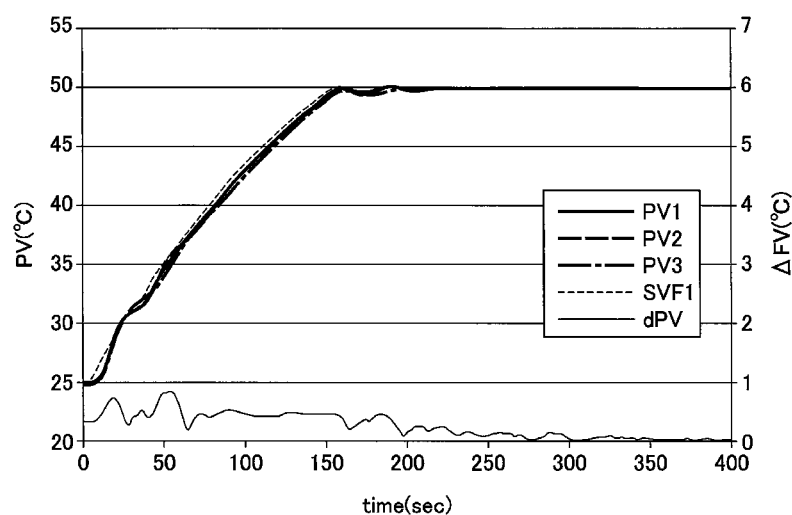
FIG. 14A is a graph showing simulation results in the exemplary embodiment.
Figure 14B:
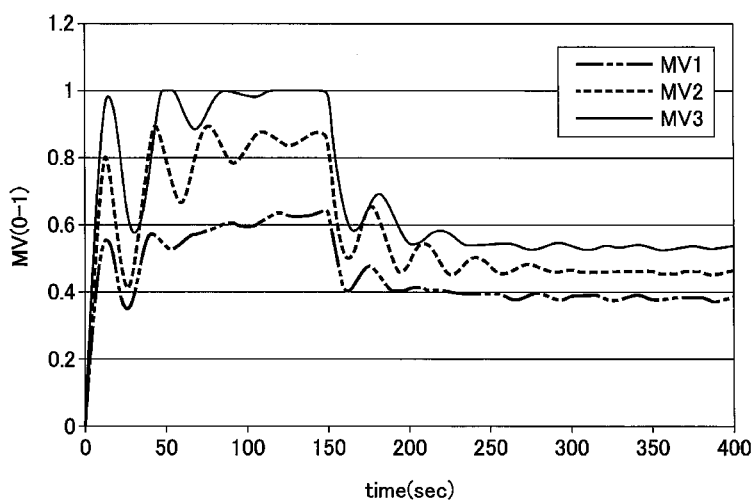
FIG. 14B is another graph showing the simulation results in the exemplary embodiment.

A control experiment was conducted using the reference model and the optimum manipulated variable pattern obtained in the above (2) and (3). Results are shown in FIGS. 14A and 14B. It is observed that the response becomes faster than that in the typical method (FIGS. 10A and 10B) and the uniformity is improved to about ⅓ of that in FIGS. 11A and 11B.

What is claimed is:

1. A temperature controller for a semiconductor wafer, the temperature controller being configured to perform a temperature control of a plurality of temperature adjusters to perform a temperature adjustment of the semiconductor wafer, the temperature controller comprising:
   a plurality of control loops set to the respective plurality of temperature adjusters, the plurality of control loops being independent of each other;
   a plurality of temperature detectors provided in the respective control loops and each configured to detect a temperature of the semiconductor wafer subjected to the temperature adjustment by the temperature adjusters; and
   a manipulated variable calculator configured to calculate a manipulated variable to be given to each of the temperature adjusters of the respective control loops,
   the manipulated variable calculator comprising:
      a reference model obtained from a response by a simulation with a plant model in which, among the plurality of control loops, a first control loop having a slowest response speed is defined to have a 100% manipulated variable, and the rest of the plurality of control loops to follow the first control loop;
      an optimum manipulated variable pattern search unit configured to search by iterative simulation for an optimum manipulated variable pattern for reaching a temperature setpoint of the semiconductor wafer in a shortest period of time using the reference model;
      a reference model output generator configured to give a manipulated variable of the optimum manipulated variable pattern searched by the optimum manipulated variable pattern search unit to the reference model to generate an output of the reference model; and
      a model following servo calculator configured to use the output of the reference model obtained by the reference model output generator as a reference trajectory of each of the plurality of control loops in model following servo control.

2. The temperature controller for the semiconductor wafer according to claim 1, wherein the optimum manipulated variable pattern search unit determines, as the shortest period of time, a time for minimizing an evaluation function J represented by a formula (1) when the temperature setpoint is denoted by SV and a response output at a time t is denoted by PV, $$J=\int |SV-PV|dt \qquad (1).$$

3. A temperature control method of a semiconductor wafer, comprising: performing a temperature control of a plurality of temperature adjusters to perform a temperature adjustment of the semiconductor wafer by a temperature controller,
   the temperature controller comprising:
      a plurality of control loops set to the respective plurality of temperature adjusters, the plurality of control loops being independent of each other;
      a plurality of temperature detectors provided in the respective control loops and each configured to detect a temperature of the semiconductor wafer subjected to the temperature adjustment by the temperature adjusters; and
      a manipulated variable calculator configured to calculate a manipulated variable to be given to each of the temperature adjusters of the respective control loops,
   wherein the manipulated variable calculator performs:
      searching by iterative simulation for a manipulated variable pattern for reaching a temperature setpoint of the semiconductor wafer in a shortest period of time using a reference model obtained from a response by a simulation with a plant model in which, among the plurality of control loops, a first control loop having a slowest response speed is defined to have a 100% manipulated variable, and the rest of the plurality of control loops to follow the first control loop;
      giving a manipulated variable of the searched optimum manipulated variable pattern to the reference model to generate an output of the reference model; and
      executing a model following servo calculation in which the output of the reference model is used as a reference trajectory of each of the control loops in model following servo control to calculate a manipulated variable for a controlled target.

4. The temperature controller for the semiconductor wafer according to claim 1, wherein each of the plurality of control loops is configured to control a temperature adjuster among the plurality of temperature adjusters to independently control a temperature of a zone among a plurality of zones of the semiconductor wafer.

5. The method according to claim 3, wherein each of the plurality of control loops is configured to control a temperature adjuster among the plurality of temperature adjusters to independently control a temperature of a zone among a plurality of zones of the semiconductor wafer.

6. The temperature controller for the semiconductor wafer according to claim 1, wherein the temperature controller is further configured to perform the temperature control of the plurality of temperature adjusters regardless of an occurrence of saturation in one or more of the plurality of temperature adjusters.

7. The temperature controller for the semiconductor wafer according to claim 1, wherein the reference model is obtained by a system identification based on the simulation with the plant model.

* * * * *